United States Patent [19]
Lee

[11] Patent Number: 6,077,734
[45] Date of Patent: Jun. 20, 2000

[54] METHOD OF FABRICATING SEMICONDUCTOR DEVICE WITH EXTREMELY SHALLOW JUNCTION

[75] Inventor: Kil Ho Lee, Kyoungki-do, Rep. of Korea

[73] Assignee: Hyundai Electronics Industries, Co., Ltd., Kyoungki-do, Rep. of Korea

[21] Appl. No.: 08/922,358

[22] Filed: Sep. 3, 1997

[30] Foreign Application Priority Data

Dec. 20, 1996 [KR] Rep. of Korea .................... 96 68903

[51] Int. Cl.$^7$ ................................ H01L 21/8234
[52] U.S. Cl. ........................ 438/197; 438/142; 438/305
[58] Field of Search ................................ 438/197, 142, 438/305, 300, 301, 350

[56] References Cited

U.S. PATENT DOCUMENTS

| | | | |
|---|---|---|---|
| 5,286,660 | 2/1994 | Chiou et al. | 437/24 |
| 5,436,176 | 7/1995 | Shimizu et al. | 437/27 |
| 5,795,808 | 8/1998 | Park | 438/301 |
| 5,872,047 | 2/1999 | Lee et al. | 438/530 |

*Primary Examiner*—Richard Elms
*Assistant Examiner*—Pho Luu
*Attorney, Agent, or Firm*—Nath & Associates PLLC; Gary M. Nath; Harold L. Novick

[57] ABSTRACT

The present invention is to provide a method for fabricating a semiconductor device which can minimize the defect density of the substrate, reduce the junction depth of the source/drain, and minimize the leakage current in the source/drain regions by implanting boron ions into the substrate in two steps which are different from each other by implant energy and implant dose.

According to the invention, this method of fabricating semiconductor device comprises the steps of forming a gate oxide layer and a gate electrode on a semiconductor substrate or on a semiconductor substrate having N-well; implanting boron ions into the substrate at first and second ion implantation steps, the interstitial point defect region caused by the first ion implantation step overlapping with the vacancy point defect region caused by the second ion implantation step; and activating the boron implanted into the substrate by means of a subsequent thermal process to form source/drain regions.

12 Claims, 3 Drawing Sheets

METHOD OF FABRICATING SEMICONDUCTOR DEVICE WITH EXTREMELY SHALLOW JUNCTION

BACKGROUND OF THE INVENTION

1. Field of the Invention

The present invention relates to a method of fabricating a semiconductor device, and in particular to a method of fabricating a semiconductor device with extremely shallow-junctioned source/drain structures.

2. Description of the Related Art

As the integration level of semiconductor devices increases, the junction depth of the source/drain structures of MOS transistor is reduced more and more, and extremely shallow source/drain junctions are becoming more important.

Referring to FIG. 1, a conventional method of fabricating a P-type semiconductor device with shallow junctions will be described. In FIG. 1, an N-type well 22 is formed in the semiconductor silicon substrate 21, and then a device isolation layer 23 is formed in the field area of the silicon substrate 21 by LOCOS process. A gate oxide layer 24, gate electrode 25, and insulator spacer 26 are then formed on the silicon substrate 21 and $BF_2$ ion implantation is performed onto the active area of silicon substrate 21 defined by the field area at the dose of $2E15/cm^2$ to $5E15/cm^2$ and the energy of 15 keV to 40 keV in order to form $P^+$ source/drain 27 of the transistor.

Thereafter, an interlayer insulator film 29, e.g. tetraethylorthosilicate glass (TEOS) layer is deposited on the entire surface of the silicon substrate 21 and then a planarizing insulator film 29 is deposited thereon.

However, when the $BF_2$ ion implantation is performed in order to create the $P^+$ source/drain 27, the surface layer of the silicon substrate 21 is damaged due to the implanted ion impact so that it becomes an amorphous silicon layer, and some point defects occur under the interface between the amorphous layer and the crystalline layer. Further, during the subsequent thermal process, the diffusivity of boron is increased due to the point defects and therefore the junction depth of the source/drain 27 is increased. In addition, some secondary defects or extended defects occur, and since the electrical activity of the boron is thus decreased, the leakage current in the junction is significantly increased. Therefore, the conventional technique is unsuitable to form an extremely shallow junction with excellent electrical characteristics.

SUMMARY OF THE INVENTION

It is an object of the present invention to provide a method for fabricating a semiconductor device which can minimize the defect density of the substrate, the junction depth of the source/drain, and the leakage current in the source/drain regions by implanting boron ions into the substrate at two steps which are different from each other by the implant energy and the implant dose.

In accordance with an aspect of the invention, the method of fabricating a semiconductor device comprises the steps of forming a gate oxide layer and a gate electrode on a semiconductor substrate or on a semiconductor substrate having an N-well; implanting boron ions into the substrate at first and second ion implantation steps, the interstitial point defect region caused by the first ion implantation step overlaps with the vacancy point defect region caused by the second ion implantation step; and activating the boron implanted into the substrate by means of a subsequent thermal process to form source/drain regions.

In accordance with other aspect of the invention, the method of a fabricating semiconductor device comprises the steps of forming a gate oxide layer and a gate electrode on a semiconductor substrate or on a semiconductor substrate having N-well; implanting boron ions into the substrate at first and second ion implantation step and the interstitial point defect region caused by the first ion implantation step being overlapping with the vacancy point defect region caused by the second ion implantation step; forming a interlayer insulation layer on the entire surface of the substrate; and forming a planarizing insulation layer on the interlayer insulation layer when making the semiconductor device.

The ion energy of the first ion implantation step is lower than that of the second ion implantation step and the boron dose of the first ion implantation step is equal to or higher than that of the second ion implantation step.

In order to exclude fluorines which cause some detrimental effects in the $BF_2$ ion implantation used in the conventional method of forming the $P^+$ source/drain, the $BF_2$ ions are substituted by boron ions so that the amorphous layer is not formed in the surface of the silicon substrate.

Further, the boron ions are implanted onto the surface in two steps which have respectively different ion energies and doses and in which the interstitial point defect region caused by the first ion implantation step overlap with the vacancy point defect region caused by the second ion implantation step. Moreover, with the boron dose of the first ion implantation step equal to or higher than that of the second ion implantation step, it is possible to suppress the first and second boron diffusions and decrease the secondary defect density. As a result, the contact resistance is decreased by increasing the electrical activity of the first-implanted boron, and since the defects of the junction region is significantly decreased due to the smaller dose of the second-implanted barons, the junction leakage currents are sufficiently decreased. Therefore, it is possible to form an extremely shallow junction which can decrease the junction leakage currents, and thus improve the reliability of the semiconductor device.

The foregoing and other objects, features and advantages of the invention will become more apparent by reference to the following detailed description of the invention and the accompanied drawings.

BRIEF DESCRIPTION OF THE DRAWINGS

For a complete understanding of the present invention, a preferred embodiment according to the present invention will now be described in detail with reference to the accompanying drawings in which.

DETAILED DESCRIPTION OF THE INVENTION

The ion projected range Rp is determined by the general ion implantation energy and the point defects such as interstials and vacancies are generated in the silicon substrate by the ion implantation. With respect to the position of the point defects, the vacancy point defects are generated in the range from the surface to the depth of 0.8 Rp under the surface and the interstitial point defects are generated in the range from the depth of Rp under the surface to the depth of 2 Rp of the surface.

According to the invention, the P-type dopant of $BF_2$ is substituted by boron ion in order to the $P^+$ source/drain regions of the semiconductor device, and the boron ion implantation is performed at two steps which have respectively different implantation energies, in order to decrease damage of the substrate due to the boron ion implantation. That is, the boron dose of the first ion implantation step is equal to or higher than that of the second ion implantation step and the ion energy of the first step is lower than that of the second step, so that the interstitial point defect region caused by the first ion implantation step overlaps with the vacancy point defect region caused by the second ion implantation step, thus eliminating the vacancies and interstitials by combining them during the initial stage of a subsequent thermal process.

Here, if the ion energy of the first implantation step is 1 keV for example, the interstitial point defects are generated in the range of the depth of 72 Å to 144 Å from the surface and if the ion energy of the second implantation step is 3 keV for example, the vacancy point defects are generated to the depth of 136 Å from the surface, and thus a region having both the vacancies and interstitials is generated. As a result, the defects are eliminated at the initial stage of the subsequent thermal process, so that the density of the secondary defects is significantly decreased after the thermal process.

On the other hand, the boron concentration near the surface is increased by setting the boron dose in the first implantation step equal to or higher than the boron dose in the second step, and the density of secondary defects is decreased during the thermal treatment as described above. Further, the electrical activity of the implanted borons is increased by decreasing the quantity of the borons gettered by the defects, and thus the contact resistance is significantly decreased.

Moreover, since the boron dose of the second step is decreased, the defects in the junction region is decreased.

Therefore, it is possible to obtain the shallow junctions and thus decrease the junction leakage currents.

The method of fabricating a semiconductor device of CMOS structures according to a embodiment of the invention will be described with reference to FIG. 2 through FIG. 5. It is obvious that the invention is also applicable to the processes of manufacturing a PMOS transistor.

Figure 1:
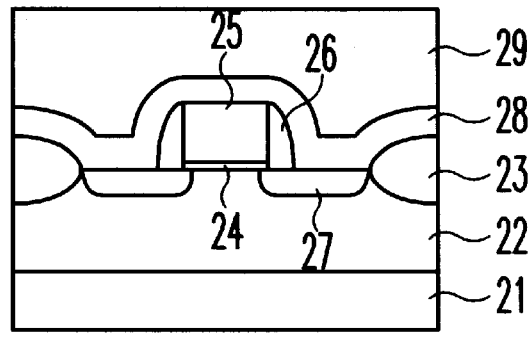
FIG. 1 is a cross sectional view illustrating a PMOS semiconductor device manufactured by the conventional method of fabricating the semiconductor device.
Figure 2:
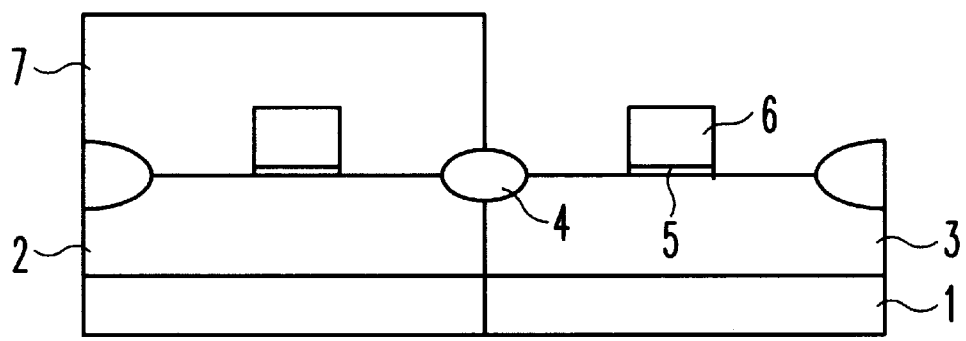
FIGS. 2 to 5 are cross sectional views showing the process steps of fabricating the CMOS semiconductor device according to a embodiment of the invention, respectively.

First, as shown in FIG. 2, N-well 2 and P-well 3 are formed over the silicon substrate 1, and then device isolation layer 4, gate oxide layer 5 and gate electrode 6 are subsequently formed over the substrate 1. After a photoresist layer 7 is formed over the N-well region 2, N-type impurities such as arsenic ions or boron ions are implanted into the P-well region 3 by the energy of 10 to 30 keV and the dose of $1E13/cm^2$ to $5E13/cm^2$ in order to form lightly doped drain structures of N-type in the P-well region 3.

Figure 3:
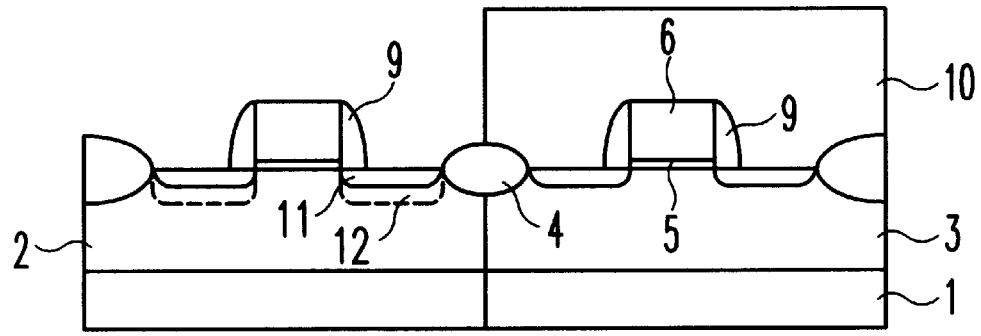

Then, after the photoresist layer 7 is removed, as shown in FIG. 3, insulator spacer 9 is formed on the sidewall of the gate electrode 6, and a photoresist layer 10 is then formed over the P-well region 3. As in the first boron implantation step, boron ions are implanted into the substrate by the energy of 1 to 3 keV and the dose of $1E15/cm^2$ to $3E15/cm^2$, for example, so that first impurity layer 11 of P-type is formed on the surface of the N-well region 2. As the second boron implantation step, the boron ions are implanted into the substrate by the energy of 3 to 9 keV and the dose of $1E15/cm^2$ to $2E15/cm^2$ so that first impurity layer 12 of P-type is formed under the first impurity layer 11.

For example, it is possible that the dose of the second ion implantation step is equal to or lower than that of the first ion implantation step and the thin oxide layer of 50 Å is grown on the surface of the silicon substrate 1 prior to the first implantation step and then the implantation steps is performed.

Figure 6:
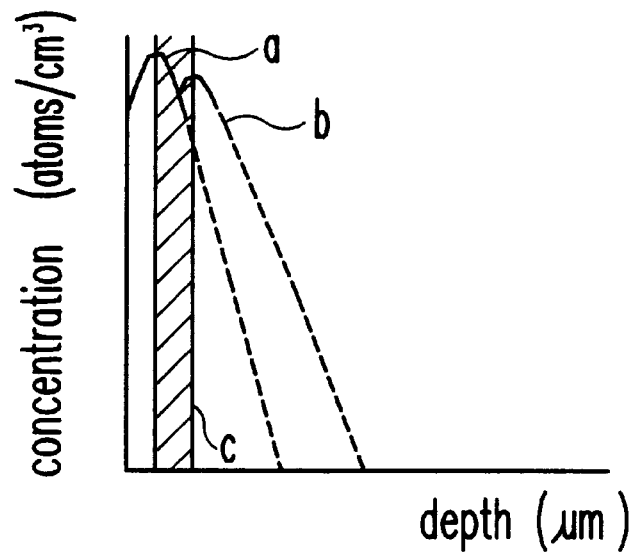
FIG. 6 is a graph showing the ion projected range Rp and the overlap portion between the interstitial point defect region and the vacancy point defect region after the first and second boron ion implantation step is performed.
Figure 7:
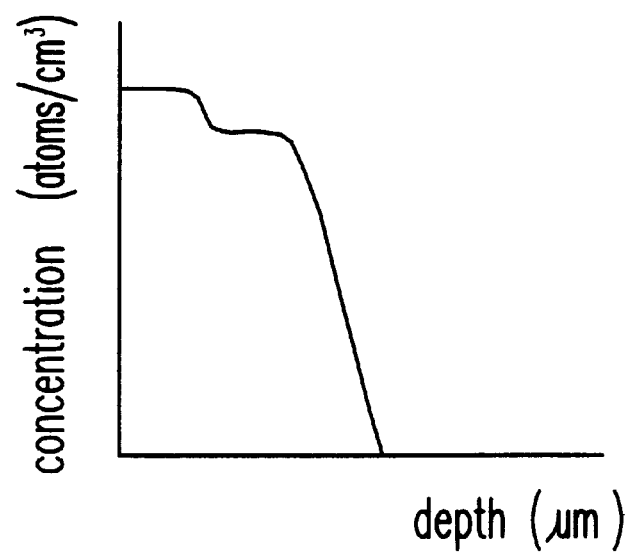
FIG. 7 is a graph showing the boron concentration along the depth from the surface of the substrate after thermal treatment is performed.

The boron concentration to the depth from the substrate is shown in FIG. 6, which is obtained by the step of FIG. 3. In FIG. 6, reference character a is the Rp by the first boron ion implantation step, b is the Rp by the second boron ion implantation step, and c is the region in which the interstitial point defects due to the first ion implantation step and the vacancy point defects due to the second step coexist based on the technical principle of the invention and in which the defects is decreased by the combination of the interstitial point defects with the vacancy point defects during subsequent heat treatment.

On the other hand, the boron concentration is increased at the surface of the silicon substrate 1 by adjusting the boron dose of the first step equal to or higher than that of the second step. Therefore, since the secondary defect density in the c region of FIG. 6 is decreased, the activity of the borons implanted at the first step increases. Further, as the boron dose of the second step is decreased, the defects due to the second step is decreased and thus the boron diffusion and the junction leakage currents are also reduced.

Figure 4:
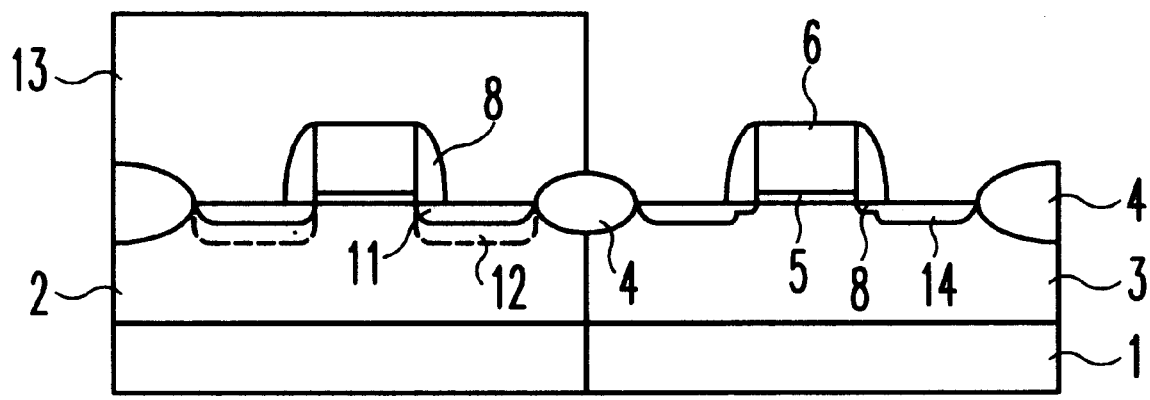

Then, after the photoresist layer 10 of FIG. 3 is stripped, as shown in FIG. 4, a photoresist layer 13 is coated over the P-well region 2. As shown in FIG. 4, As ions are implanted into the substrate 1 by the energy of 20 to 40 keV and the dose of $3E15/cm^2$ to $6E15/cm^2$ in order to form $N^+$ source/drain 14.

Figure 5:
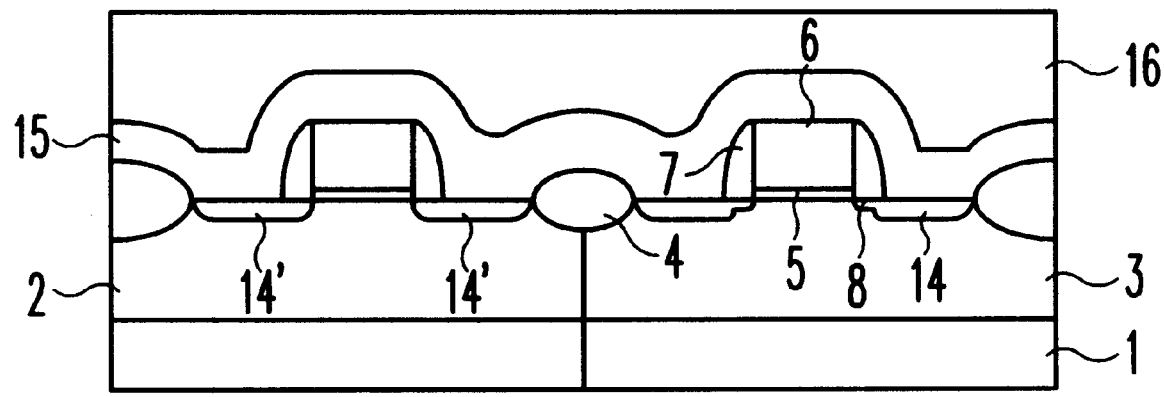

As shown in FIG. 5, after the photoresist layer 13 is removed, an interlayer insulator layer 15 is deposited and a planarizing insulation layer 16 is then deposited over the interlayer insulator layer 15. At the time of depositing the interlayer insulation layer 15 and the planarizing insulation layer 16, and annealing them, the impurities implanted into the substrate is more deeply diffused into the substrate, so that the junction areas of the source/drain 14 and 14' is extended.

The interlayer insulation layer 15 may by a TEOS layer deposited by LPCVD or a oxide layer deposited by medium temperature CVD and the thickness of the layer 15 may be about 300 Å to 800 Å.

Further. the planarizing insulation layer 16 may be a BPSG layer deposited by APCVD or PECVD and the thickness thereof may be about 2500 Å through 4000 Å. In order to planarize the BPSG layer, a thermal annealing is performed at the temperature of 800° C. to 850° C. for 10 to 30 minutes.

As another embodiment, the substrate is processed at the temperature of 850 to 1000° C. for 2 to 30 seconds by RTA process before the deposition of the interlayer insulation layer 15 and then the interlayer insulation layer 15 is deposited in above condition. Then, the planarizing insulation layer 16 is deposited over the substrate by any of CVDs and it may be polished by CMP process so that its thickness becomes 2500 to 4000 Å.

As described above, according to the invention, the P-type dopant of $BF_2$ is substituted by boron ion in order to the P+ source/drain regions of the semiconductor device, and the boron ion implantation is performed at two steps which have respectively different implantation energies, in order to decrease the damages of the substrate due to the boron ion implantation.

That is, the boron dose of the first ion implantation step is equal to or higher than that of the second ion implantation step and the ion energy of the first step is lower than that of the second step, so that the interstitial point defect region caused by the first ion implantation step overlaps with the vacancy point defect region caused by the second ion implantation step, thus eliminating the vacancies and interstitials by combining them during the initial stage of a subsequent thermal process. Moreover, since the boron dose of the second step is decreased, the defects in the junction region is decreased. Therefore, it is possible to obtain the shallow junctions and thus decrease the junction leakage currents.

EFFECT OF THE INVENTION

Therefore, according to the invention, the P-type dopant of $BF_2$ is substituted by boron ion in order to the P+ source/drain regions of the semiconductor device, and the boron ion implantation is performed at two steps which have respectively different implantation energies, in order to decrease the damages of the substrate due to the boron ion implantation.

That is, the boron dose of the first ion implantation step is equal to or higher than that of the second ion implantation step and the ion energy of the first step is lower than that of the second step, so that the interstitial point defect region caused by the first ion implantation step is overlapped with the vacancy point defect region caused by the second ion implantation step, thus eliminating the vacancies and interstitials by combining them during the initial stage of a subsequent thermal process. Moreover, since the boron dose of the second step is decreased, the defects in the junction region is decreased. Further, it is possible to obtain the shallow junctions and thus decrease the junction leakage currents. Therefore, it is possible to form an extremely shallow junction which can decrease the junction leakage currents, and thus improve the reliability of the semiconductor device.

Although only certain embodiments have been described in detail, those having ordinary skill in the art will certainly understand that many modifications are possible without departing from the teachings hereof. All such modifications are intended to be encompassed within the scope of the following claims.

What is claimed is:

1. A method of fabricating a semiconductor device, comprising the steps of:
   forming a gate oxide layer and a gate electrode on a semiconductor substrate or on a semiconductor substrate having an N-well;
   implanting boron ions into the substrate at first and second ion implantation steps, an interstitial point defect region caused by the first ion implantation step being overlapped with a vacancy point defect region caused by the second ion implantation step; and
   activating the boron implanted into the substrate by means of a subsequent thermal process to form source/drain regions,
   wherein an ion energy of the first ion implantation step is lower than that of the second ion implantation step and a dose of the first ion implantation step is equal to or hither than that of the second ion implantation step.

2. The method according to claim 1 wherein the ion energy of the first ion implantation step is 1 to 3 keV and the dose of the first ion implantation step is 1 to 3E15/ $cm^2$.

3. The method according to claim 1 wherein the ion energy of the first ion implantation step is 3 to 9 keV and the dose of the first ion implantation step is 1 to 3E15/$cm^2$.

4. The method according to claim 1, further comprising the step of growing a thin oxide layer on the surface of the substrate before the first and second ion implantation step are performed.

5. A method of fabricating a semiconductor device, comprising the steps of:
   forming a gate oxide layer and a gate electrode on a semiconductor substrate or on a semiconductor substrate having an N-well;
   implanting boron ions into the substrate at first and second ion implantation steps, an interstitial point defect region caused by the first ion implantation step being overlapped with a vacancy point defect region caused by the second ion implantation step;
   forming an interlayer insulation layer on an entire surface of the substrate; and
   forming a planarization insulation layer on the interlayer insulation layer,
   wherein an ion energy of the first ion implantation step is lower than that of the second ion implantation step and a dose of the first ion implantation step is equal to or higher than that of the second ion implantation step.

6. The method according to claim 5 wherein the ion energy of the first ion implantation step is 1 to 3 keV and the dose of the first ion implantation step is 1 to 3E15/$cm^2$.

7. The method according to claim 5 wherein the ion energy of the first ion implantation step is 3 to 9 keV and the dose of the first ion implantation step is 1 to 3E15/$cm^2$.

8. The method according to claim 5, wherein the interlayer insulation layer is a TEOS layer deposited by LPCVD or a HTO layer the thickness thereof is 300 to 800 Å.

9. The method according to claim 5, wherein the planarizing insulation layer is a BPSG layer by APCVD or PECVD and the thickness thereof is 2500 to 4000 Å.

10. The method according to claim 5 further comprising the step of annealing the planarizing insulation layer at the temperature of 800 to 850° C. for 10 to 30 minutes to planarizing the surface of the substrate.

11. The method according to claim 10, wherein the annealing step is performed at the temperature of nitrogen gas.

12. The method according to claim 5, further comprising the step of annealing the substrate at the temperature of 850 to 1000° C. for 2 to 30 seconds before the deposition of the interlayer insulation layer.

* * * * *

UNITED STATES PATENT AND TRADEMARK OFFICE
CERTIFICATE OF CORRECTION

PATENT NO. : 6,077,734
DATED : June 20, 2000
INVENTOR(S) : Lee

It is certified that error appears in the above-identified patent and that said Letters Patent is hereby corrected as shown below:

Claim 1, line 17, change "hither" to -- higher--

Signed and Sealed this

Twenty-ninth Day of May, 2001

Attest:

NICHOLAS P. GODICI

Attesting Officer

Acting Director of the United States Patent and Trademark Office